INVENTOR
Loyd H. Clevenger
BY Kenneth Glaser
ATTORNEY

ATTORNEY

United States Patent Office 3,534,234

Patented Oct. 13, 1970

3,534,234

MODIFIED PLANAR PROCESS FOR MAKING SEMICONDUCTOR DEVICES HAVING ULTRA-FINE MESA TYPE GEOMETRY

Loyd H. Clevenger, Grapevine, Tex., assignor to Texas Instruments Incorporated, Dallas, Tex., a corporation of Delaware Filed Dec. 15, 1966, Ser. No. 601,970
Int. Cl. H01l 7/36, 11/00
U.S. Cl. 317—235 6 Claims

ABSTRACT OF THE DISCLOSURE

Semiconductor devices are made by a modified planar process which permits ohmic contacts to be made to smaller geometries than heretofore possible. A semiconductor mesa structure is surrounded with an insulating layer having an exposed surface coplanar with the exposed surface of the mesa. The desired PN junction geometry is then formed in the mesa by selective diffusion, followed by metallization to provide ohmic contacts that extend beyond the periphery of the mesa, since the smallest contact geometry provided by the state of the art is too large to be accommodated wholly within such periphery.

Figure 1A:
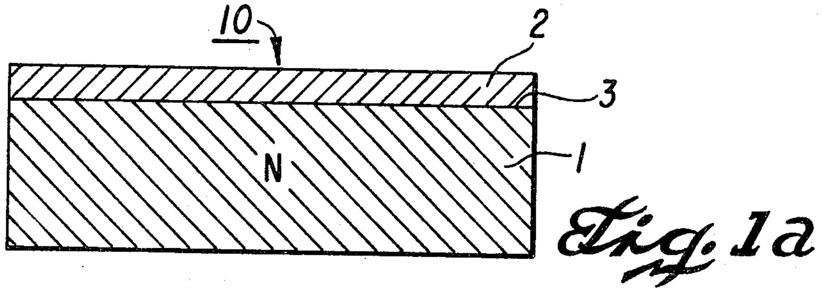

This invention relates to semiconductor devices. More particularly it relates to semiconductor devices of very small geometry and to the method of making the same.

The planar process for manufacturing semiconductor devices, such as diodes and transistors having all P-N junctions surfacing on the same face of a substrate, is quite well known in semiconductor art. For example, in the case of a transistor having two P-N junctions, an emitter-base junction and a base-collector junction both surfacing on the same surface of a semiconductor substrate, the exposed junctions on the surface have to be protected by insulation, first to protect the junctions from surface contamination and second to enable metallic interconnections to be made to the different regions of the transistor. A common method of protecting and insulating the surface of a silicon semiconductor device, for example, is by the use of a thermally grown or a pyrolytically deposited layer of silicon oxide on the surface of the substrate.

Diodes and transistors for microwave applications must be extremely small in order to decrease the capacitive losses associated with the size of the semiconductor junctions (the larger the junction, the greater the capacity of the junction). However, the minimum size of a transistor, for example, is limited by the manufacturing capability of the present state of the art. To protect the collector-base and base-emitter junctions in a planar device, either in discrete or integrated circuit form, the protective oxide layer covers both of the mentioned junctions. By so doing, the oxide layer encroaches on the possible areas available for making contact to the emitter and base regions. Because of the limitation of the present alignment techniques used to form the different semiconductor regions and windows in the oxide layer, the minimum size geometry of a device must be larger than would be possible if part of the base and emitter regions did not have to be covered by portions of the oxide layer.

With this problem in mind, it is an object of this invention to provide a semiconductor device having very small geometry.

Another object of the invention is to provide a semiconductor device in which the base-collector junction does not intersect the face of the semiconductor substrate.

Still another object of the invention is to provide a semiconductor device in which only a portion of the emitter-base junction intersects a face of the semiconductor substrate.

It is a further object of the invention to provide a method of making a semiconductor device in which the base-collector junction does not intersect the face of the semiconductor substrate.

It is still a further object of the invention to provide a method of making a semiconductor device in which only a portion of the emitter-base junction intersects the face of the semiconductor substrate.

Figure 2A:
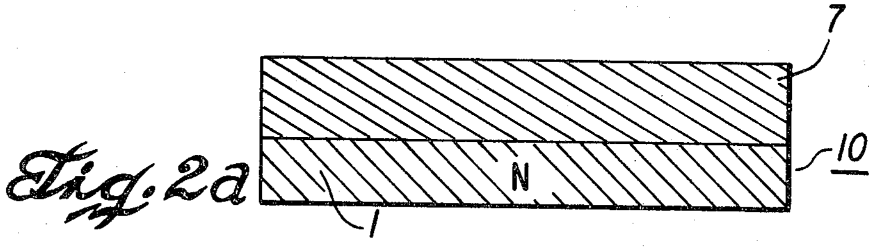
Figure 2B:
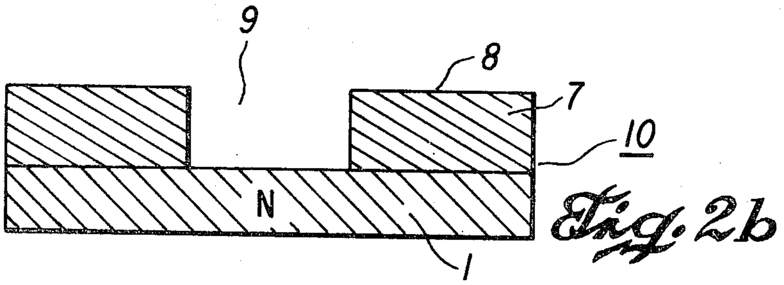
Figure 2C:
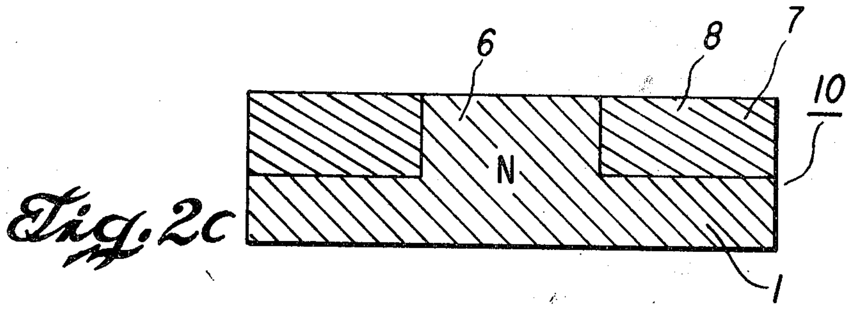
Figure 4B:
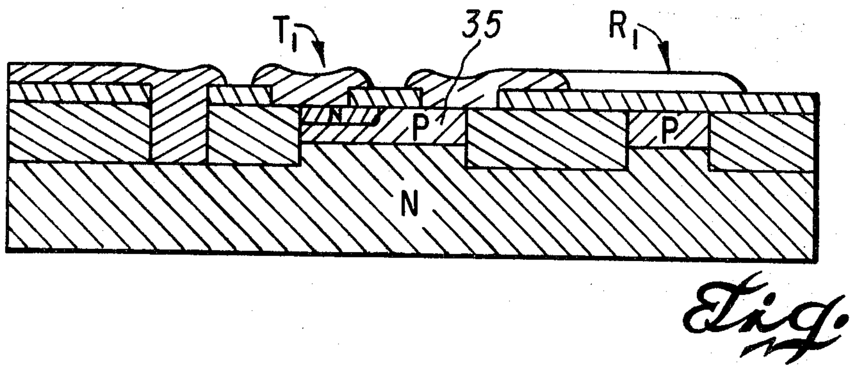
Figure 4A:
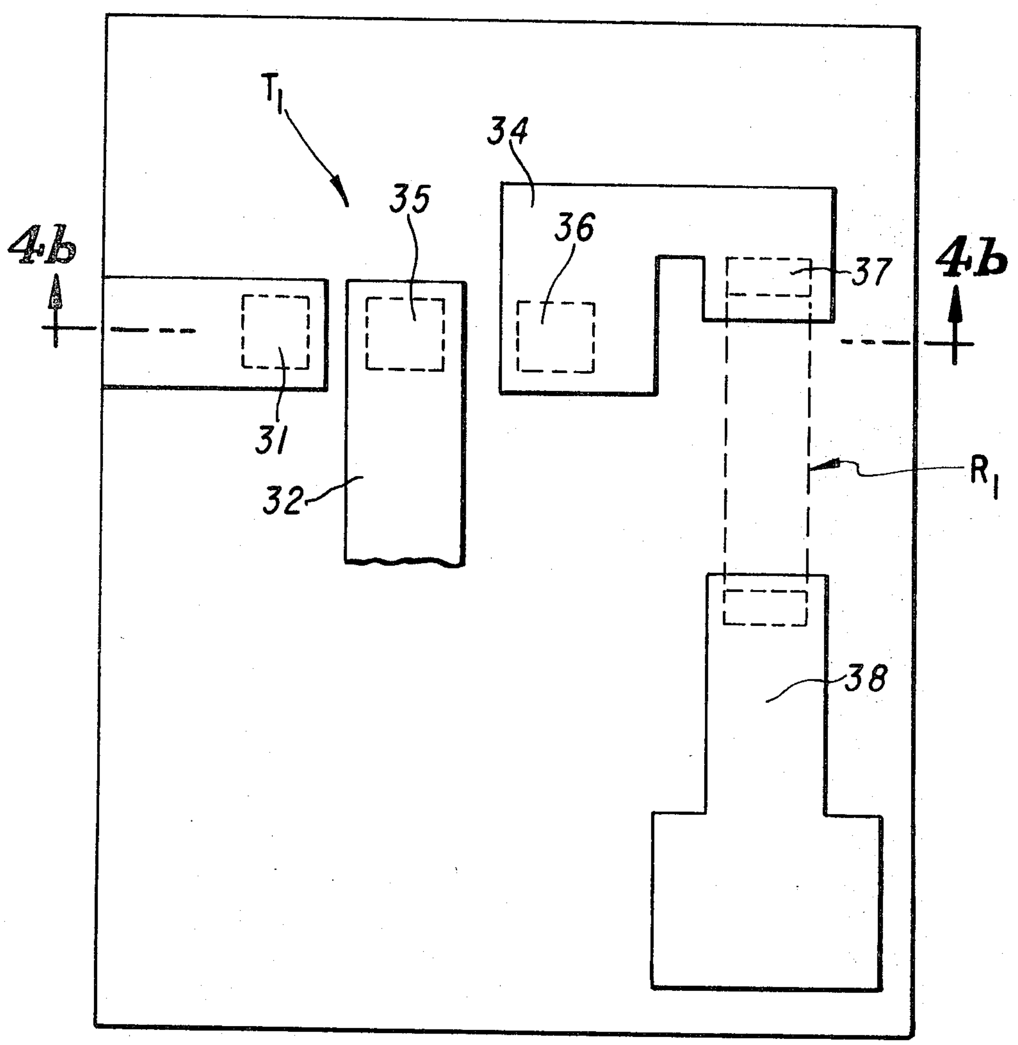

The novel features believed to be characteristic of the invention are set forth in the appended claims. The invention itself, however, as well as other objects and advantages thereof may best be understood by reference to the following detailed description when read in conjunction with the appended claims and accompanying drawings, wherein:

FIGS. 1*a*–1*f* are sectional views of a portion of a semiconductor substrate illustrating one embodiment of the mesa fabrication according to the invention;

FIGS. 2*a*–2*c* are sectional views of a semiconductor substrate illustrating another embodiment of the mesa fabrication according to the invention;

FIGS. 3*a*–3*f* are sectional views of a semiconductor substrate illustrating semiconductor region fabrication and terminal connection according to the invention;

FIG. 4*a* is a top view of a portion of an integrated circuit illustrating a resistor and a transistor fabricated according to the process of the invention; while FIG. 4*b* is a sectional view along the line **4*b*—4*b*** of a portion of the integrated circuit shown in FIG. 4*a*.

A transistor fabricated by the method of the present invention utilizes a mesa of semiconductor material, surrounded by a first silicon oxide insulating layer which, in turn, extends to the end of the substrate surface. In diffusing the base region of the transistor, only the exposed surface of the mesa is subjected to the diffusing impurities and therefore, the base-collector junction lies essentially parallel to and below the face of the mesa, the junction intersecting only the edge of the mesa. Because there is no intersection of the base-collector junction with the face of the mesa, all of the surface area of the base region can be used for subsequent operations. This allows a much smaller geometry for the device than is possible with the conventional planar configuration since according to the invention no portion of the face of the base region is used for base-collector junction protection. Although the process of this invention can be used to fabricate diodes and transistors from any number of semiconductor materials such as germanium, silicon and gallium arsenide, for ease of description silicon only is described as the semiconductor material used.

Referring now to the different figures of the drawings, FIG. 1 represents a sectional view of a portion of a semiconductor substrate generally indicated by the numeral 10, on which a transistor is to be formed. Only the portion adacent the upper surface of the substrate is shown, it being appreciated that the substrate is of substantially greater thickness, a typical substrate being from about 8 to 12 milliinches in thickness. Further, although the substrate 10 will be described for convenience as eventually containing only a transistor, an integrated circuit having the necessary number of transistors, diodes, resistors and other required components could easily be formed as well in the substrate. During the fabrication process, it is customary for each substrate to be a part of a larger semiconductor slice containing a large number of other substrates, each a duplication of the others. The semiconductor substrate 10 can be either high resistivity P or N conductivity type semiconductor material, or, when a low resistivity collector contact path is desired, a high resistivity region (N conductivity type silicon, for example) can be epitaxially deposited on a low resistivity substrate of N+ conductivity type silicon.

The substrate 10, which at this stage is only the substrate of N conductivity type silicon, is cleaned and placed within a conventional reactor furnace. An insulating layer 2 of silicon nitride $Si_3N_4$, for example, of approximately 1,000 to 2,000 A. in thickness is formed upon the surface 3 of the substrate 1 by a conventional deposition process. Such a process is well known in the semiconductor industry and therefore will not be further described here.

Figure 1B:
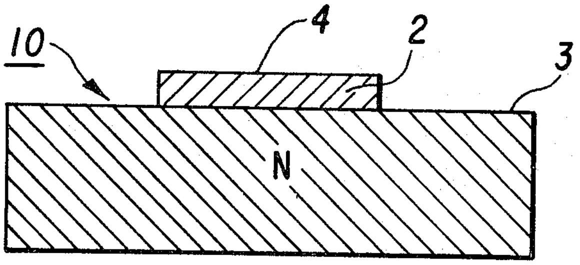

After the silicon nitride layer 2 is formed, the substrate 10 (now consisting of the substrate 1 and silicon nitride layer 2) is removed from the reactor furnace. A photoresist mask (not shown) and made from such a photosensitive material as KMER, made by Eastman Kodak Corporation, is formed on the surface 4 of the silicon nitride layer 2. The mask and the exposed portion of the silicon nitride layer are subjected to a suitable etch, such has a phosphoric acid etch, for a time sufficient to remove all but the desired portion of the silicon nitride layer protected by the mask, as shown in FIG. 1*b*.

Figure 1C:
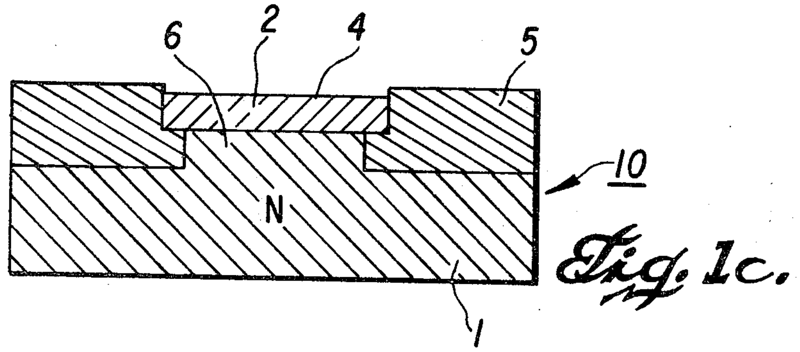

After the mask is removed, the substrate 10 containing the remainder of the silicon nitride layer 2 is placed in a furnace containing an oxidizing atmosphere at a temperature between about 1100° C. to 1300° C. for a period of time sufficient to grow a layer 5 of silicon oxide to a height slightly above the surface 4 of the silicon nitride layer 2 as indicated in FIG. 1*c*. It should be noted that, because the silicon oxide 5 is thermally grown from the surface 3 of the silicon substrate 1, the silicon oxide 5 penetrates into the substrate from the exposed area of the surface 3 to form the mesa 6.

Figure 1D:
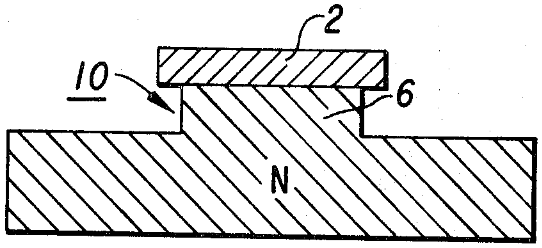

The silicon oxide layer 5 surrounding the mesa 6 is now removed by subjecting the substrate 10 to a dilute hydrofluoric acid etch which does not appreciably affect the silicon substrate nor the silicon nitride layer, as shown in FIG. 1*d*.

Figure 1E:
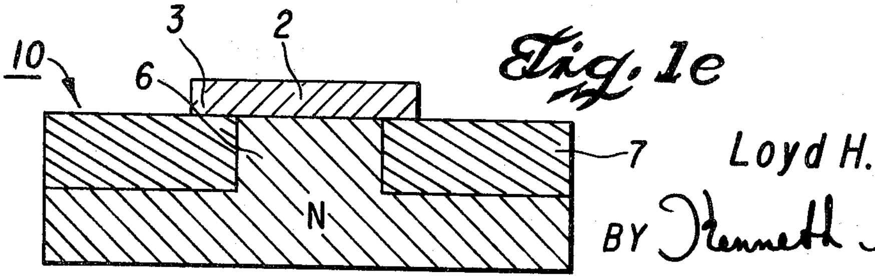

After the silicon oxide layer 5 has been removed, the wafer 10 is placed in a furnace containing an oxidizing atmosphere at a temperature of between about 1100° C. to about 1300° C. for a period of time sufficient to produce a second layer of silicon oxide 7 surrounding the mesa 6 to a level approximately that of the surface 3, as shown in FIG. 1*e*. The silicon nitride layer 2 is not affected by the oxidizing atmosphere and protects the face of the mesa 6 from oxidation.

It should be noted in passing that the depth of the silicon oxide 5 is so controlled that, following the growth of the second oxide layer, the resulting mesa 6 will be the desired height. The mesa 6, therefore, is not formed by etching away the material surrounding the mesa, but by oxidizing the material surrounding the mesa.

It should also be noted that the first insulating layer 2 is of silicon nitride or some other material such as silicon carbide, for example, rather than the conventional silicon oxide layer. The reason for this is to protect the silicon beneath the nitride layer from being oxidized (and therefore the mesa 6 reduced in depth) when the layer 5 of silicon oxide is formed by thermal oxidation.

Figure 1F:
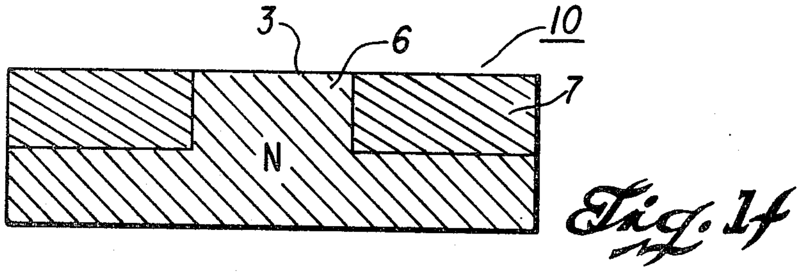

The wafer 10 is removed from the oxidizing furnace and subjected to a phosphoric acid etch for a period of time sufficient to remove the protective layer of silicon nitride 2, thereby leaving the mesa 6 with its exposed face 3 surrounded by a silicon oxide layer 7, as shown in FIG. 1*f*. As previously stated, and referring once again to FIGS. 1*b*, 1*c* and 1*d*, the oxidizing layer 5 is replaced after its removal by the oxidizing layer 7. The reason for the second oxide layer is that when silicon oxidizes, the silicon oxide occupies a volume of about 40% more than the volume of the original silicon that oxidizes. Therefore, in order to attain a planar relationship between the surface of the mesa 6 and the surface of the surrounding oxide after the mesa 6 is formed to the desired height, a double oxidation step is used.

Another embodiment of isolated mesa fabrication is shown in FIGS. 2*a* through 2*c*, the designations therein being identical to those in FIGS. 1*a*–1*f* for similar parts and elements. A substrate 10 which at this stage is only the N conductivity type semiconductor substrate 1, is cleaned and placed in a furnace containing an oxidizing atmosphere at a temperature of about 1100° C. to 1300° C. for a period of time sufficient to grow a silicon oxide layer 7, as shown in FIG. 2*a*.

A photoresist mask (not shown) is formed on the surface 18 of the silicon oxide layer 7, with an opening exposing a portion of the silicon oxide layer 7. The mask and exposed portion of the silicon substrate 1 are subjected to a light hydrofluoric acid etch for a period of time sufficient to form the window 9 in the silicon oxide layer 7 exposing a portion of the silicon substrate, as shown in FIG. 2*b*.

After the photoresist mask is removed, the substrate 10 is placed in a conventional reactor furnace and N conductivity type silicon is epitaxially grown within the window 9 to form the mesa 6, thus filling the window 9 to the level of the surface 8 of the silicon oxide layer 7, as shown in FIG. 2*c*. By judiciously maintaining the ratio of the area of exposed silicon on the surface of the substrate to the area of the silicon oxide, very little of the silicon will be epitaxially deposited upon the surface 8 of the silicon oxide layer. It should be apparent that the structure indicated in FIG. 2*c* is equivalent to the structure in FIG. 1*f* although the fabrication steps required to reach the end result differ in both cases.

Figure 3A:
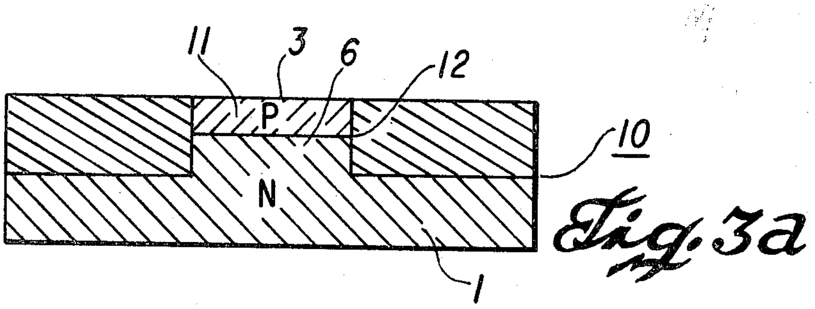

In FIG. 3*a* is shown the substrate 10 in FIGS. 1*a*–1*f* following the diffusing of a P conductivity type impurity into the mesa 6 to form the base region 11 of a transistor. The diffusion is accomplished by placing substrate 10 in a conventional diffusion furnace. The diffusing impurity penetrates to an essentially equal depth across the mesa 6 so that the base collector junction 12 between the base region 11 and the substrate 1 which acts as the collector region of the transistor does not intersect the face 3 of the mesa 6. Therefore, all the face of the mesa can be used for subsequent operations without the necessity of using any part of the mesa face for junction protection.

Figure 3B:
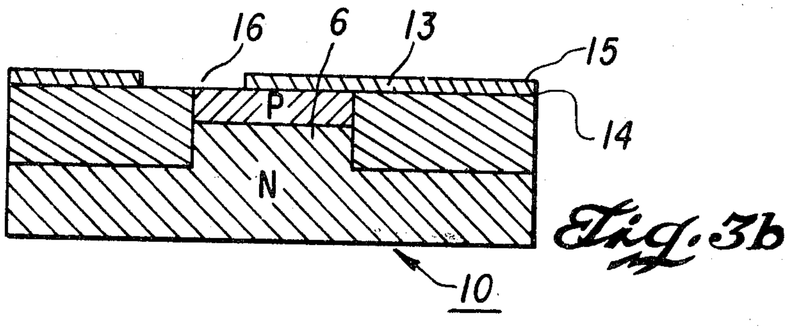

Following removal of the thin glaze on the surface of the mesa 6 caused by the diffusion operation, a layer of silicon oxide 13 is deposited by conventional pyrolytic methods upon the face 14 of the substrate 10. The surface 15 of the silicon oxide layer 13 is then masked with a suitable photoresist coating (not shown) which has an opening to allow the etching of the silicon oxide layer 13 in the desired location. The mask and the silicon oxide layer 13 are subjected to a light hydrofluoric acid etch for a period of time sufficient to etch the window 16 as shown in FIG. 3*b*.

Figure 3C:
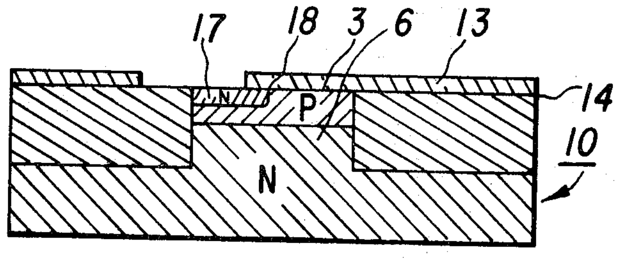

The photoresist mask is removed and the substrate 10 is placed in a conventional diffusion furnace. An emitter region 17 is formed, as shown in FIG. 3*c*, by subjecting the substrate to an N conductivity type impurity laden atmosphere. It will be noted that only part of the emitter-base junction 18 intersects the face of the mesa 6 beneath the silicon oxide layer 13. By not having all of the emitter-base junction 18 intersecting the mesa face 3, more of the emitter region 17 can be utilized for making the emitter contact than is possible using the conventional planar configuration.

Figure 3D:
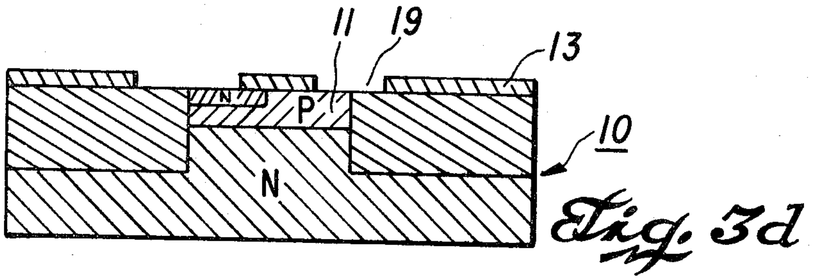

The thin glaze on the surface of the emitter region 17 is removed and another photoresist mask is applied to the face of the substrate 10 with an opening to correspond to the desired location for the base contact. The photoresist mask and the exposed surface of the silicon oxide layer 13 are subjected to a light hydrofluoric etch for a period of time sufficient to form the base contact window 19 in the silicon oxide layer 13 which allows contact to the base region 11, as shown in FIG. 3*d*.

Figure 3E:
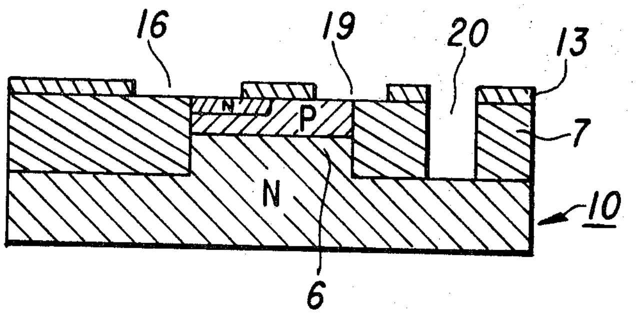

The surface of the wafer 10 is again covered by a photoresist mask with an opening to correspond to the location desired for the collector contact. The mask, the exposed silicon oxide layer 13, and the silicon oxide layer 7 are subjected to a hydrofluoric acid etch for a period of time sufficient to remove the exposed silicon oxide layers and form the collector contact window 20 down to the semiconductor substrate 1, which substrate acts as the collector region of the transistor, as shown in FIG. 3*e*. If low collector contact resistance is desired, the window 20 would expose an N+ conductivity type substrate which has an N type conductivity layer epitaxially deposited to form the mesa 6.

Figure 3F:
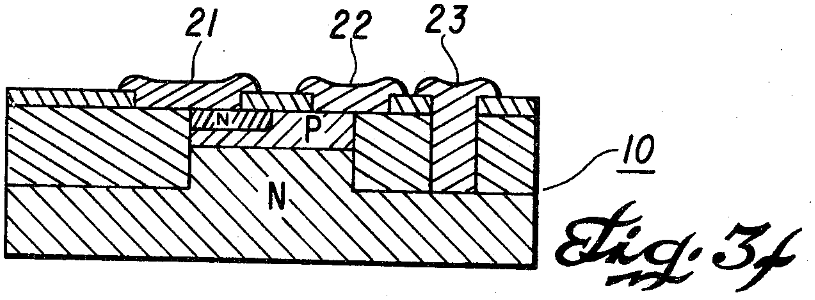

After the photoresist mask is removed the substrate 10 is placed in a conventional reactor furnace and a layer of a suitable metal such as aluminum is deposited by evaporation or sputtering on the surface of the substrate. The substrate is removed from the furnace and the surface of the metal layer (not shown) is covered by a photoresist mask which exposes portions of the metal layer. The mask and exposed portions of the metal layer are subjected to an etch condition for a period of time sufficient to form the emitter terminal 21, the base terminal 22, and the collector terminal 23 and all necessary interconnections of the device, as shown in FIG. 3*f*.

In FIG. 4*a* is shown the top view of a portion of an integrated circuit fabricated according to the invention. The terminal 30 makes contact to the emitter region 31 of a transistor $T_1$, while terminals 32 and 34 make contact to the base region 35 and the collector region 36, respectively. Terminal 34 also makes contact to one end of a resistor $R_1$. Terminal 38 makes contact to the opposite end of the resistor $R_1$.

The resistor $R_1$ shown in FIG. 4*b*, which is a section view along line 4*b*—4*b* of FIG. 4*a*, is formed during the same diffusion process that forms the base region 35 of the transistor $T_1$. The resistor $R_1$ and transistor $T_1$ are formed according to the process steps described in connection with FIGS. 3*a* through 3*f*.

Although preferred embodiments of the invention have been described in detail, it is to be understood that various changes, substitutions, and alterations can be made therein without departing from the spirit and scope of the invention as defined by the appended claims.

What is claimed is:

1. A semiconductor device comprising:

(a) a semiconductor substrate having a mesa of semiconductor material of one conductivity type;

(b) a first insulating layer surrounding said mesa, the outer surface of said insulating layer being substantially coplanar with the top of said mesa;

(c) a first semiconductor region of opposite conductivity type in said mesa forming a first p-n junction between said first region and said semiconductor material, said p-n junction being essentially parallel to and beneath the surface of said mesa and extending to the edge of said mesa;

(d) a second semiconductor region of said one conductivity type in said first semiconductor region, but offset from the center thereof, thereby forming a second p-n junction between said first region and said second region, a portion of said second p-n junction terminating at the interface between said first insulating layer and said mesa; and (e) a second insulating layer on said first insulating layer and said surface of said mesa, said second ininsulating layer having windows exposing said first region, said second region, and said substrate, and metal terminals on said second insulating layer making contacts to said first region, said second region, and said substrate through said windows.

2. The semiconductor device as defined in claim 1 wherein the substrate is silicon and the first and second insulating layers are silicon oxide.

3. An integrated circuit comprising:

(a) a semiconductor substrate having a plurality of mesas of one conductivity type, (b) a first insulating layer surrounding the perimeters of said mesas, having its outer surface substantially coplanar with the tops of said mesas, (c) a plurality of first semiconductor regions of opposite conductivity type in said mesas thereby forming a plurality of first PN junctions between said first regions and subjacent material, each of said PN junctions being essentially parallel to and below the surface of each of said mesas and extending to the perimeters of said mesas, (d) a second semiconductor region of said one conductivity type in, but offset from, the center of each of said first semiconductor regions, thereby forming a plurality of second PN junctions between said first regions and said second regions, each of said second PN junctions having a portion which terminates at the interface between said mesas and said first insulating layer, and a portion which terminates at said surfaces of said mesas, (e) a second insulating layer on said first insulating layer and said surfaces of said mesas, said second insulating layer having windows exposing said first regions, said second regions and said substrate, and (f) metallic terminals on said second insulating layer making contact to said first regions, said second regions and said substrate through said windows.

4. The integrated circuit as defined in claim 3 wherein the substrate is silicon and the first and second insulating layers are silicon oxide.

5. A semiconductor device comprising a semiconductor substrate having a semiconductor mesa on one surface thereof, insulating material surrounding said mesa on said one surface, the outer surface of said insulating material being substantially coplanar with the top of said mesa, a zone of one conductivity type in said mesa having a surface portion at the top of said mesa and a portion extending to the edge of said mesa, said zone having a conductivity type opposite to that of adjacent semiconductor material and defining therewith a p-n junction terminating at said top and said edge of said mesa, and an electrical connection to said zone contacting said surface portion and a portion of said insulating material.

6. The semiconductor device of claim 5 including another electrical contact extending through an opening in said insulating material to said substrate.

References Cited

UNITED STATES PATENTS

| | | | |
|---|---|---|---|
| 3,304,595 | 2/1967 | Sato | 29—25.3 |
| 3,345,222 | 10/1967 | Nomura | 148—175 |
| 2,972,092 | 2/1961 | Nelson | 317—235 |

JOHN W. HUCKERT, Primary Examiner

M. H. EDLOW, Assistant Examiner

U.S. Cl. X.R.

148—175, 186; 317—234